United States Patent
Nakayama et al.

(10) Patent No.: US 9,608,217 B2
(45) Date of Patent: Mar. 28, 2017

(54) TRANSISTOR ELEMENT

(75) Inventors: Ken-ichi Nakayama, Yonezawa (JP); Junji Kido, Yonezawa (JP); Ryotaro Akiba, Yonezawa (JP); Naomi Oguma, Tokyo (JP); Naoki Hirata, Tokyo (JP)

(73) Assignees: DAINICHISEIKA COLOR & CHEMICALS MFG. CO., LTD., Tokyo (JP); Ken-ichi Nakayama, Yonezawa-shi, Yamagata (JP)

( * ) Notice: Subject to any disclaimer, the term of this patent is extended or adjusted under 35 U.S.C. 154(b) by 0 days.

(21) Appl. No.: 14/396,023

(22) PCT Filed: Apr. 27, 2012

(86) PCT No.: PCT/JP2012/061439
§ 371 (c)(1),
(2), (4) Date: Oct. 21, 2014

(87) PCT Pub. No.: WO2013/161078
PCT Pub. Date: Oct. 31, 2013

(65) Prior Publication Data
US 2015/0325805 A1    Nov. 12, 2015

(51) Int. Cl.
*H01L 51/00*  (2006.01)
*H01L 51/05*  (2006.01)
*H01L 51/10*  (2006.01)

(52) U.S. Cl.
CPC ........ *H01L 51/0504* (2013.01); *H01L 51/105* (2013.01); *H01L 51/0036* (2013.01); *H01L 2251/301* (2013.01); *H01L 2251/308* (2013.01)

(58) Field of Classification Search
CPC ............... H01L 51/0504; H01L 51/105; H01L 51/5203; H01L 2251/301; H01L 51/0036;
(Continued)

(56) References Cited

U.S. PATENT DOCUMENTS 8,053,769 B2 * 11/2011 Chu .................. H01L 27/28
257/103
8,120,242 B2 * 2/2012 Yokoyama ............ B82Y 10/00
313/504
(Continued)

FOREIGN PATENT DOCUMENTS

JP    2003-101104    4/2003
JP    2007-258308    10/2007
(Continued)

OTHER PUBLICATIONS

Nakayama et al., "High Current Amplification in p-Type Metal-Base Transistors Using Pentacene Films", 2012, Applied Physics Express, vol. 5, pp. 094202-1-094202-3, published on Sep. 4, 2012.*
(Continued)

*Primary Examiner* — Nikolay Yushin
(74) *Attorney, Agent, or Firm* — Hamre, Schumann, Mueller & Larson, P.C.

(57) ABSTRACT

The present invention provides a transistor element having a laminated structure, the laminated structure comprising a sheet-like base electrode being arranged between an emitter electrode and a collector electrode; at least one p-type organic semiconductor layer being provided on each of the surface and the back sides of the base electrode; and a current transmission promotion layer being formed, on each of the surface and back sides of the base electrode, between the base electrode and the p-type organic semiconductor layer or layers provided on each of the surface and back sides of the base electrode. According to the present invention, it becomes possible to provide a transistor element (MBOT) that is, in particular, stably supplied through a simple production process, has a structure capable of being mass-produced, and has a large current modulation effect
(Continued)

and an excellent ON/OFF ratio at a low voltage in the emitter electrode and the collector electrode.

9 Claims, 2 Drawing Sheets

(58) Field of Classification Search
CPC ....... H01L 2251/308; H01L 2251/5321; H01L 2251/5361
See application file for complete search history.

(56) References Cited

U.S. PATENT DOCUMENTS

| | | | |
|---|---|---|---|
| 8,564,130 B2* | 10/2013 | Fujimoto | B82Y 20/00 257/746 |
| 8,927,972 B2* | 1/2015 | Nakayama | B82Y 10/00 257/40 |
| 2009/0256140 A1* | 10/2009 | Meng | G01N 21/6428 257/40 |
| 2010/0073056 A1* | 3/2010 | Chu | H01L 51/0504 327/171 |
| 2010/0213447 A1* | 8/2010 | Fujimoto | B82Y 20/00 257/40 |
| 2012/0146011 A1* | 6/2012 | Nakayama | H01L 51/0504 257/40 |

FOREIGN PATENT DOCUMENTS

| | | |
|---|---|---|
| JP | 2009-272442 | 11/2009 |
| JP | 2010-135809 | 6/2010 |
| JP | 2010-251472 | 11/2010 |
| JP | 2010-263144 | 11/2010 |
| WO | WO 2007/119490 | 10/2007 |
| WO | WO 2011/027915 | 3/2011 |

OTHER PUBLICATIONS

Ou et al.: "All-organic hot-carrier triodes with thin-film metal base"; Applied Physics Letters, 89, 183508 (2006), 4 pages.

Yang et al.: "Vertical organic triodes with a high current gain operated in saturation region"; Applied Physics Letters, 89, 183511 (2006), 4 pages.

Huang et al.: "Ambipolar permeable metal-base transistor based on NPB/ $C_{60}$ heterojunction"; Organic Electronics, 10, 210-213 (2009).

Watatsuki and Akiba et al.: "P-Type Operation in Metal Base Organic Transistors., Abstracts—Symposium U: Charge Generation/Transport in Organic Semiconductor Materials", Materials Research Society, 2011 MRS Fall Meeting & Exhibit, Boston MA, U8.13 (2011), 2 pages.

* cited by examiner

TRANSISTOR ELEMENT

TECHNICAL FIELD

The present invention relates, in particular, to a transistor element that exhibits an excellent current modulation property, and, in more detail, to a transistor element that is excellent in current amplification factor to perform large current modulation with a low voltage capable of driving an organic EL display or the like.

BACKGROUND ART

In recent years, the spread of thin-type TVs and laptops has been progressing, and the performance requirements for display devices such as a liquid crystal display, an organic EL display, and electronic paper have been desired to be higher. Furthermore, the display devices are further becoming finer, smaller, and thinner with the spread of high-function cellular phones and tablet-type terminal devices. A field effect transistor (Field Effect Transistor: FET) has been used for driving such display elements. Currently, FETs using silicon that is an inorganic material have been extensively used, however displays using an organic transistor element have been reported with a goal of reduction in cost, reduction in weight, and flexibilization, and the practical application of such displays has been expected.

However, in many of the displays using an organic transistor element, an organic field effect transistor (OFET) and a liquid crystal display part or electrophoretic cell are combined. It is difficult to obtain a large current from the OFET due to its structure and low mobility, and examples in which the OFET is used for a driver element of an organic EL display being a current-driven device that requires a large current have rarely been reported. Therefore, the development of an organic transistor element that is capable of driving an organic EL display and operates with a large current at a low voltage has been desired.

Currently, it is necessary that the channel length of the transistor element be made short in order to obtain a large current using the OFET, however it is difficult to make the channel length several μm or less with the patterning technology taking mass production into consideration. In order to solve the problem, studies on a "vertical type transistor structure" by which the operation can be performed with a low voltage and a large current by applying current in the direction of film thickness have been studied. The element that is used for a vertical type sandwiched device has, in general, a film thickness of several tens of nano meters to several hundreds of nano meters, and the control of the film thickness with a high accuracy of the order of a nanometer or less is possible. The short channel length of 1 μm or less can easily be achieved with the vertical type transistor by making a channel in the film thickness direction (vertical direction), and thereby there is a possibility that a large current is obtained. As such a vertical type organic transistor element, a vertical type transistor with a polymer grid triode structure using a self-organizing network structure of a polyaniline film as a grid electrode, a static induction transistor (Static Induction Transistor: SIT) that controls a current between a source and a drain by modulating depletion layer width with a finely striped intermediate electrode, and so on have been known so far.

Moreover, a technique that provides a vertical type organic transistor element exhibiting a high-performance transistor property by preparing an organic semiconductor/metal/organic semiconductor laminated structure has been proposed (Patent Literature 1). In the vertical type transistor element, an organic semiconductor layer and a striped intermediate metal electrode are provided between an emitter electrode and a collector electrode. In the organic transistor element, electrons injected from the emitter electrode transmit the intermediate metal electrode, thereby current modulation similar to that of a bipolar transistor can be observed, and since the intermediate metal electrode works like a base electrode, the organic transistor element is called a metal-base organic transistor (Metal-Base Organic Transistor: hereinafter, referred to as "MBOT").

In the MBOT, almost no current flows when output voltage is applied between the emitter electrode and the collector electrode while voltage is not applied between the emitter electrode and the base electrode, however a current flows between the emitter electrode and the collector electrode when the voltage is applied between the emitter electrode and the base electrode. The current that flows between the emitter electrode and the collector electrode is a collector current, and the current that flows between the base electrode and the collector electrode is a base current. In the MBOT, the collector current is rapidly increased compared with the base current that is increased by applying a base voltage, and therefore the MBOT becomes an element with which the modulation of the collector current by the base voltage is made possible. A "leakage current" that flows when the voltage is applied between the emitter electrode and the collector electrode while the voltage is not applied between the emitter electrode and the base electrode is an OFF current, and the current that flows when the voltage is applied between the emitter electrode and the base electrode is an ON current. The MBOT is a transistor element in which the OFF current is nearly zero and with which a large ON current is obtained.

Moreover, as an example of a structure of the organic transistor (MBOT), an MBOT that can easily be produced by using a transparent ITO electrode as a collector electrode and laminating organic semiconductor/metal/organic semiconductor layers on the transparent ITO electrode by means of vacuum deposition has been reported (Patent Literature 2). In the MBOT, dimethyl perylene tetracarboxylic acid diimide (Me-PTCDI) and fullerene (C60) each being an n-type organic semiconductor material are used as an organic semiconductor, and, as electrode materials, Al (aluminum) is used as a base electrode and Ag (silver) is used as an emitter electrode. The MBOT becomes a transistor element in which the ON/OFF ratio (the ratio of the ON current to the OFF current) is improved, the transistor element capable of performing large current modulation by introducing a dark current suppression layer and applying heat treatment to the base electrode. As described here, the MBOT has a characteristic that a fine grid electrode and fine pattering of a stripe electrode are not necessary even though the MBOT is a vertical type transistor.

Moreover, as an example of the organic transistor element (MBOT), an MBOT (Patent Literature 3) having an organic semiconductor layer and a sheet-like base electrode between the emitter electrode and the collector electrode and having an energy barrier layer and a charge transmittance-promoting layer between the base electrode and the collector electrode, and further an MBOT (Patent Literature 4) in which an organic semiconductor layer comprising perylene tetracarboxylic acid diimide having a long chain alkyl group is provided on the side of the collector electrode to utilize as a collector layer have been proposed, and it has been reported that a favorable current modulation property and ON/OFF ratio can be obtained without applying heat treatment. Furthermore, an MBOT in which an organic semiconductor layer being present between the emitter electrode and the base electrode has a diode structure has been reported as a transistor element having a favorable amplification property (Patent Literature 5).

Moreover, as an example of the vertical type transistor, an element having an organic semiconductor layer between the emitter electrode and the collector electrode; a base electrode with concaves and convexes obtained by forming a comb-shaped aluminum layer on sheet-like aluminum; a pentacene layer formed between the emitter electrode and the base electrode; N,N'-diphenyl-N,N'-di(1-naphtyl)-1,1'-biphenyl-4,4'-diamine (NPB) formed as a hole injection layer; a thin film of lithium fluoride formed as a charge injection promoting layer; and a semiconductor laminated layer comprising pentacene and copper phthalocyanine between the collector layer and the base electrode has been reported as a transistor having a current amplifying property (Non Patent Literature 1 and 2).

Moreover, as an example of the vertical type transistor, a permeable metal substrate organic transistor having an organic semiconductor layer and a sheet-like base electrode between the emitter electrode and the collector electrode, the permeable metal substrate organic transistor utilizing a heterojunction organic semiconductor layer comprising N,N'-diphenyl-N,N'-di(1-naphtyl)-1,1'-biphenyl-4,4'-diamine (hereinafter, abbreviated as "NPB")/fullerene (C60) for both of the organic semiconductor layer between the emitter electrode and the base electrode and the organic semiconductor layer between the collector electrode and the base electrode has been reported as a bipolar transistor (Non Patent Literature 3).

Moreover, as an example of the vertical type transistor, it has been reported that a vertical type transistor having an organic semiconductor layer and a comb-shaped base electrode between the L-shaped emitter electrode and the collector electrode in which vertical type transistor the organic semiconductor layer comprises BTQBT, [bis(1,2,5-thiadizolo)-p-quinobis(1,3-dithiol)], exhibits a large current value and ON/OFF ratio even though the organic semiconductor layer comprises a hole-transporting material (Patent Literature 6).

Moreover, there has been a proposal about an organic transistor element (MBOT) using a highly crystalline organic semiconductor layer between the emitter electrode and the collector electrode (Patent Literature 7). And in the literature, it is described that an MBOT using methylperylene that is an electron-transporting material exhibits a large current value, as large as 300 mA/cm$^2$ and a high ON/OFF ratio, as high as 200, between the emitter and the collector with a low voltage by making a transistor element using the organic semiconductor layer with a crystal size being about the same thickness as the base electrode.

CITATION LIST

Patent Literature

Patent Literature 1: JP-A-2003-101104
Patent Literature 2: JP-A-2007-258308
Patent Literature 3: JP-A-2009-272442
Patent Literature 4: JP-A-2010-263144
Patent Literature 5: International Publication No. WO 2011/027915A1
Patent Literature 6: JP-A-2010-251472
Patent Literature 7: JP-A-2010-135809

Non Patent Literature

Non Patent Literature 1: Ou et al, Applied Physics Letters, 89: 183508 (2006)
Non Patent Literature 2: Yi-Yang et al, Applied Physics Letters, 89: 183511 (2006)
Non Patent Literature 3: J. Hung et al, Organic Electronics, 10, 210-213 (2009)

SUMMARY OF INVENTION

Technical Problem

However, regarding the vertical type transistor with a polymer grid triode structure and the static induction transistor (SIT), it is difficult to enhance performance and conduct mass production due to the difficulty of forming an intermediate electrode. Moreover, regarding the organic transistor elements (MBOT) described in Patent Literatures 1 and 2, it sometimes occurs that the OFF current becomes high depending on the film thickness or structure, and it is not always the case in the above-described transistor that the current modulation action can be observed whenever the organic semiconductor/metal/organic semiconductor laminated structure is prepared. Therefore, in order to achieve stable performance and to obtain a large current value, a high amplification factor, and a high ON/OFF ratio, it is necessary that an oxidized layer be provided on the surface of the base electrode by heat treatment to make an OFF current suppression layer. Moreover, the organic transistor element (MBOT) described in Patent Literature 3 can amplify a current without applying heat treatment to the electrode by providing a charge transmittance-promoting layer having an insulation property under the base electrode, however it is difficult to obtain a large current, a large amplification factor, and a large ON/OFF ratio sufficient for operating an electronic appliance, and it is also difficult to conduct stable operation as an MBOT made from a hole-transporting material. Moreover, the transistor element described in Patent Literature 4 is limited to an n-type organic semiconductor layer, and materials for the transistor element are also limited. Moreover, the same applies to the technique described in Patent Literature 5, and the development of an MBOT formed from the p-type organic semiconductor layer having more excellent properties has been desired.

Moreover, the organic transistor element described in Patent Literature 6 exhibits the current modulation by forming an organic semiconductor layer from BTQBT as a hole-transporting material, however the materials that can be used for the organic transistor element are limited, the synthesis of the materials has to be conducted through a multi-stage process so that mass synthesis is difficult, the shape of the electrode of the element such as comb-shaped or L-shaped electrode is complicated, and therefore it is difficult to conduct mass production of the element stably through a simple production process.

Moreover, with the organic transistor element described in Patent Literature 7, a large current is achieved by using a highly crystalline organic transistor layer, however it is difficult to operate the organic transistor element with the p-type organic materials, and it is still difficult to drive electronic devices.

Moreover, the organic transistor elements described in Non Patent Literatures 1 and 2 operate as a transistor having a current amplifying property by forming a hole injection layer comprising NPB and a charge injection promoting layer comprising lithium fluoride, however the organic transistor elements have a current density of about 12 mA/cm² and a current amplification property of about 48 at the maximum, and it is still difficult to obtain the large current modulation that is large enough to drive electronic devices. Moreover, it is necessary that the base electrode be formed as a comb-shaped metal layer on a metal thin film, and the organic semiconductor layer to be formed between the base electrode and the collector electrode is also limited to a laminated multi-layered structure.

The transistor described in Non Patent Literature 3 shows the current modulation action as a bipolar transistor element and thereby has a possibility of utilization for a complementary logic circuit or the like, however it is difficult to obtain a current value or current enhancement that is large enough to operate electronic appliances, and it is difficult to utilize as an element for driving an organic EL element or the like.

Accordingly, the present invention has been made to solve the problems, and an object of the present invention is to make it possible to provide a transistor element (MBOT) that can be supplied, in particular, through a simple production process; has a structure with which mass production is made possible; has a large current modulation action under a low voltage and is excellent in ON/OFF ratio between the emitter electrode and the collector electrode.

Solution to Problem

The object is achieved by the following present invention. That is, the present invention provides a transistor element having a laminated structure, the laminated structure comprising: a sheet-like base electrode being arranged between an emitter electrode and a collector electrode; at least one p-type organic semiconductor layer being provided on each of the surface and back sides of the base electrode; and further a current transmission promotion layer being formed, on each of the surface and back sides of the base electrode, between the base electrode and the p-type organic semiconductor layer or layers provided on each of the surface and back sides of the base electrode.

The following items are listed as preferable embodiments of the present invention. The current transmission promotion layer is a layer comprising an alkali metal compound and/or an alkaline earth metal compound; the current transmission promotion layer is a layer comprising lithium fluoride; the current transmission promotion layer has a thickness of 0.1 to 10 nm; at least one hole injection layer is provided between the emitter electrode and the p-type organic semiconductor layer provided on the side of the emitter electrode; the p-type organic semiconductor layer provided on the side of the collector electrode has a laminated structure comprising two or more different p-type organic semiconductor layers; a collector current $I_{C\text{-}ON}$ flowing by applying voltage ($V_B$) between the emitter electrode and the base electrode and further applying voltage ($V_C$) between the emitter electrode and the collector electrode is 10 mA/cm² or more, and the transistor element exhibits a current modulation property that an ON/OFF ratio ($I_{C\text{-}ON}/I_{C\text{-}OFF}$) being a ratio of the collector current $I_{C\text{-}ON}$ to a collector current $I_{C\text{-}OFF}$ flowing by applying the voltage ($V_C$) between the emitter electrode and the collector electrode without applying the voltage ($V_B$) between the emitter electrode and the base electrode is 50 or more, and further the transistor element exhibits a current modulation property that a current amplification factor of a modulated collector current $I_C$ becomes 50.

Advantageous Effects of Invention

According to the present invention, an organic transistor element (MBOT) having excellent properties described below is provided. The transistor element of the present invention is characterized in that the transistor element has a laminated structure, the laminated structure comprising: a sheet-like base electrode being arranged between an emitter electrode and a collector electrode; at least one p-type organic semiconductor layer being provided on each of the surface and back sides of the base electrode; and further a current transmission promotion layer being formed, on each of the surface and back sides of the base electrode, between the base electrode and the p-type organic semiconductor layer or layers provided on each of the surface and back sides of the base electrode. That is, in the transistor element of the present invention, at least two p-type organic semiconductor layers are arranged as described above to each of the surface and back sides of the base electrode, and further a current transmission promotion layer is provided between the base electrode and the collector electrode and between the emitter electrode and the base electrode, respectively, thereby achieving that the current modulation action which makes it possible to obtain a large current with a low voltage can stably be obtained.

The organic transistor element (MBOT) of the present invention has, as described later, high performance and is useful as an element for driving various types of displays and an organic light emitting diode, and especially useful for an element for driving an organic EL or electronic paper which is driven by the large current modulation. The transistor element which drives the above-described devices is required to have a contrast between during ON time and during OFF time, and a higher ON/OFF ratio and more suppression of dark current are required. That is, when the ON/OFF ratio is low and the dark current is large, there occurs a problem that the organic EL device emits light even during OFF time or the like. On the other hand, the transistor element of the present invention has a high ON/OFF ratio, is excellent in large current modulation property and frequency property in a low frequency region, and thereby exhibits high performance as a transistor element for drive and is sufficiently applicable.

Moreover, with the organic transistor element of the present invention, the large current modulation in the low voltage region can be conducted, an occupancy area of the transistor element in one pixel can be made small, an increase in the numerical aperture of the display is made possible, and as a result thereof, by applying these properties to a display, the display with high performance and high efficiency can be achieved. Moreover, preparation by a vapor deposition method can be conducted, it is possible to form a transistor element on a flexible substrate such as plastics, and the preparation of a display or device that is made small and light-weighted, made light-weighted, and made thin becomes possible.

Moreover, in the organic transistor element of the present invention, the organic semiconductor layer is formed from a hole-transporting material which exhibits the p-type operation, and therefore there is an advantage that the kinds of materials which form the organic semiconductor layer are abundant as compared with the case of the electron-transporting materials which exhibit the n-type operation that the kinds of usable materials are limited. Thus, it is possible to select the p-type organic semiconductor layer having the most suitable energy level for the material constitution of the transistor element. Moreover, a hole-transporting material that is a polymer or oligomer can be utilized, and it is possible to form the organic semiconductor layer by a printing method as well as a vapor deposition method. As a result thereof, preparation of a large area element by a low temperature process, reduction in environmental load become possible, and reduction in production cost can be realized. Furthermore, regarding the n-type organic semiconductor layer formed from an electron-transporting material, the transportation of charges (electrons) is inhibited by an oxygen molecule or a water molecule, however regarding the p-type organic semiconductor layer formed from a hole-transporting material, the transportation of charges (holes) is not inhibited by an oxygen molecule or a water molecule, and therefore there is also a possibility that an element can be driven in the atmospheric air.

The effect of the present invention is hereinafter described in more detail. The transistor element that the present invention provides becomes a current modulation type transistor element, as illustrated in FIG. 1, in which, when voltage ($V_C$) is applied between an emitter electrode 12 and a collector electrode 11 and further voltage ($V_B$) is applied between the emitter electrode 12 and a base electrode 13, a collector current $I_C$ that is more modulated than a base current $I_B$ that flows between the emitter electrode 12 and the base electrode 13 flows. More specifically, the modulated collector current $I_C$ becomes 10 mA/cm$^2$ or more, and it becomes possible to obtain a current amplification factor (collector current $I_C$/base current $I_B$) of 50 or more. According to the study made by the present inventors, it becomes possible to further obtain a current amplification factor of 500 or more. Moreover, the organic transistor element that the present invention provides exhibits an extremely excellent current modulation property that the organic transistor element has an ON/OFF ($I_{C-ON}/I_{C-OFF}$) (hereinafter, written as an ON/OFF ratio) of 1,000 or more, or further 10,000 or more depending on the circumstance, the ON/OFF ratio being the ratio of a collector current $I_{C-ON}$ (hereinafter, written as an ON current) that flows by applying voltage ($V_B$) between the emitter electrode 12 and the base electrode 13 and further applying voltage ($V_C$) between the emitter electrode 12 and the collector electrode 11 to a collector current $I_{C-OFF}$ (hereinafter, written as an OFF current) that flows by applying the voltage ($V_C$) between the emitter electrode 12 and the collector electrode 11 without applying the voltage ($V_B$), and the application to various types of usage is expected.

DESCRIPTION OF EMBODIMENTS

Hereinafter, the present invention will be described in detail with regard to the embodiments of the present invention, however the present invention is not limited to the following embodiments and can be carried out within the range not departing the gist of the present invention.

The organic transistor element (MBOT) of the present invention is characterized in that the organic transistor element (MBOT) has a laminated structure, the laminated structure comprising: a sheet-like base electrode being arranged between an emitter electrode and a collector electrode; at least one p-type organic semiconductor layer being provided on each of the surface and back sides of the base electrode; and further a current transmission promotion layer being formed, on each of the surface and back sides of the base electrode, between the base electrode and the p-type organic semiconductor layer or layers provided on each of the surface and back sides of the base electrode. In addition, in the present invention, the current transmission promotion layer is formed on both of the surface side and the back side of the base electrode, one is sometimes referred to as a collector layer side current transmission promotion layer, and the other is sometimes referred to as an emitter layer side current transmission promotion layer, because of their arrangement.

Figure 1:
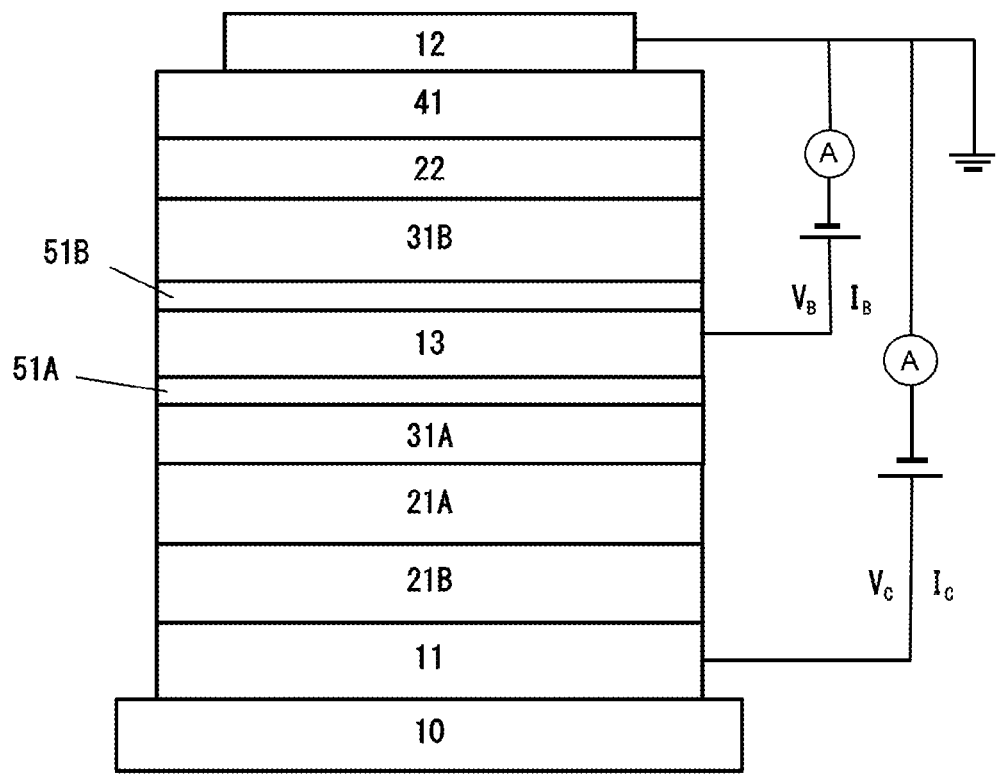
FIG. 1 is a diagram illustrating the constitution of a transistor element of the present invention.

One example of a structure of the transistor element (MBOT) of the present invention is illustrated in FIG. 1, and, as illustrated in FIG. 1, the element of the present invention comprises a laminated structure of organic semiconductor/electrode/organic semiconductor and is a vertical type organic transistor that can be prepared by a simple laminating process. As exemplified in FIG. 1, the laminated structure has a base electrode 13 between a collector electrode 11 and an emitter electrode 12 each formed on a substrate 10, and has current transmission promotion layers 31A and 31B, which are characteristics of the present invention, formed on the surface and back sides of the base electrode 13, respectively, and further the transistor element of the present invention is constituted by p-type organic semiconductor layers laminated on each of the surface and back sides of the base electrode through each of these current transmission promotion layers. More specifically, the transistor element of the present invention is characterized in that the organic semiconductor layer has a collector layer 21 comprising at least one p-type organic semiconductor layer arranged between the collector electrode 11 and the base electrode 13; an emitter layer 22 comprising at least one p-type organic semiconductor layer arranged between the emitter electrode 12 and the base electrode 13; further the base electrode 13 provided at the position sandwiched by these p-type organic semiconductor layers, and current transmission promotion layers 31A and 31B formed on each of the surface and back sides of the base electrode. That is, as exemplified in FIG. 1, the transistor element of the present invention has a laminated structure, as a basic constitution, in which the collector electrode 11, the collector layer 21, the collector layer side current transmission promotion layer 31A, the base electrode 13, the emitter layer side current transmission promotion layer 31B, the emitter layer 22, and the emitter electrode 12 are laminated in this order on the substrate 10.

As described above, one of the characteristics of the transistor element of present invention is that a structure of the current transmission promotion layer formed between the base electrode and the p-type organic semiconductor layer is made so as to form a laminated structure having the collector layer side current transmission promotion layer 31A and the emitter layer side current transmission promotion layer 31B. As a result of diligent studies, the present inventors have found that the following remarkable effect can be obtained by forming the above-described particular laminated structure and it becomes possible to achieve a useful organic transistor element (MBOT) the practical use of which is expected, and the present inventors have reached the present invention. That is, charges (holes) transmit the base electrode efficiently by making a laminated structure in which the current transmission promotion layer is formed on each of the surface and back sides of the base electrode, it becomes possible to inject charges (holes) from the emitter layer 22 to the collector layer 21 efficiently, and further the effect that the charges (holes) can be transferred from the collector layer 21 to the collector electrode 11 can be obtained. Therefore, the current transmission promotion layers 31A and 31B each having the above-described particular laminated structure as specified in the present invention can control the flow of the current and have the effect of increasing the collector current flowing from the emitter electrode 12 to the collector electrode 11; suppressing a leakage current; and maintaining the OFF current small. Furthermore, since a large output modulation operation and a large current modulation operation can stably be conducted even in a low voltage region, the transistor element of the present invention is useful for an organic transistor element (MBOT).

Hereinafter, the performance of the transistor element of the present invention will be described in more specifically. The transistor element of the present invention exhibits a large current value and a large current amplification factor, and, according to the study made by the present inventors, in a transistor element having a p-type organic semiconductor layer formed from pentacene for example, when the performance of the transistor element having a current transmission promotion layer on each of the surface and back sides of the base electrode is compared with the performance of the transistor element not having the current transmission promotion layers, it has been found that the transistor element of the present invention exhibits excellent performance because the collector current is large, about 2 times larger, and the current amplification factor is 230 times or more. According to the study made by the present inventors, by providing the collector layer side current transmission promotion layer formed between the base electrode and the collector layer, the effects of (1) reducing the OFF current and (2) increasing the current amplification factor with the ratio of the base current to the collector current becoming large are exhibited. Moreover, by providing the emitter layer side current transmission promotion layer between the base electrode and the emitter layer, it becomes possible to (1) make the collector current large due to the highly efficient charge transfer to the collector layer and the increase in the charge injection rate; and (2) reduce the OFF current due to the improvement of the electrode interface, and, as a result thereof, the current amplification factor and the ON/OFF ratio can be made large. Furthermore, the effect that a large output modulation and a large current modulation can be conducted stably in the low voltage region is brought about.

The present inventors considers as follows regarding the principle through which the above-described remarkable performance can be obtained with the transistor element of the present invention having the above-described particular laminated structure. That is, the present inventors infer as follows regarding the mechanism from the facts that [1] the base current value is dramatically decreased, the collector current is largely increased, and the OFF current is hardly increased due to the emitter layer side current transmission promotion layer, and that [2] the collector current value is largely increased and the OFF current is hardly increased due to the collector layer side current transmission promotion layer formed under the base electrode. First of all, the current transmission promotion layer is formed on each of the surface and back sides of the base electrode, thereby the current transmittance rate at the base electrode is enhanced (promoted) when the charges (holes) accelerated by voltage flow from the emitter layer through the base electrode into the collector layer, and moreover it is made possible to efficiently inject holes, which have been injected from the emitter electrode into the emitter layer, into the collector layer with holes not being retained in the emitter layer, and in addition to this, it becomes possible to control the flow of charges (holes) from the base electrode to the side of the collector electrode also in the collector layer, and the mechanism through which the charge transporting property is largely enhanced (promoted) by the above-described facts is considered. Moreover, it has been found that the formation of the current transmission promotion layer on each of the surface and back sides of the base electrode brings about, due to the synergistic effect of the emitter layer side current transmission promotion layer and the collector side current transmission promotion layer, the effect of obtaining a large current amplification factor that has never been obtained when only the collector layer side current transmission promotion layer or emitter layer side current transmission promotion layer is formed.

Moreover, the characteristic of another embodiment of the transistor element of the present invention is, in addition to the above-described constitution, that a hole injection layer is further formed at the interface of the emitter electrode and the p-type organic semiconductor layer. By making such constitution, the injection barrier from the emitter electrode into the p-type organic semiconductor layer is reduced and the charges (holes) can be injected more efficiently from the emitter electrode into the emitter layer. Examples of a forming material for the hole injection layer that is provided between the emitter electrode and the emitter layer include porphyrins, phenylamines, starburst type amines, phthalocyanines, metal oxides such as vanadium oxides, molybdenum oxides, ruthenium oxides, and aluminum oxides, and derivatives of amorphous carbon, polyaniline, polythiophene, and so on.

When the collector voltage $V_C$ is applied between the emitter electrode and the collector electrode and further the base voltage $V_B$ is applied between the emitter electrode and the base electrode, the holes injected from the emitter electrode are accelerated due to the action of the base voltage, and the ON current that flows in the transistor element of the present invention transmits the base electrode and reaches the collector electrode. That is, the base current $I_B$ that flows when the base voltage $V_B$ is applied between the emitter electrode and the base electrode is considered to be a current that does not transmit the base electrode and is amplified to be transformed to the collector current $I_C$ that flows between the emitter electrode and the collector electrode by the application of the base voltage. Therefore, with the transistor element of the present invention having the above-described performance, the current modification action similar to that of a bipolar transistor can stably be obtained, and large output modulation and large current amplification are made possible.

On the other hand, since the current transmission promotion layer is formed from a thin film of an insulator, the OFF current of the transistor element (MBOT) of the present invention exhibits a rectifying effect, and the current hardly flows from the base electrode to the emitter electrode during the OFF time. Therefore, in the case where the voltage $V_B$ is not applied ($V_B$=0 V), the leakage current (the OFF current that flows during the OFF time) that is unnecessary for the operation of the transistor can effectively be prevented from flowing between the base electrode and the collector electrode, and, as a result thereof, the ON/OFF ratio can be enhanced. Thus, in the case where the organic transistor element (MBOT) is used as a transistor element for driving an organic EL device, it is desirable that the transistor element of the present invention have an ON/OFF ratio of 50 or more because when the dark current is large, the luminescence of the organic EL element occurs during the OFF time thereby bringing about the lowering of the contrast between during the ON time and during the OFF time. More preferably, the transistor element for drive is required to have an ON/OFF ratio of 1,000 or more, however according to the transistor element of the present invention, it is possible to make the ON/OFF ratio even 10,000 or more, and the ON/OFF ratio of 10,000 or more can easily be achieved.

Furthermore, regarding the current value of the transistor element (MBOT) of the present invention, large amplification can be obtained, a large current can be obtained even in a low voltage region, and the transistor element of the present invention becomes extremely useful from this viewpoint. The organic EL element is, in general, an element that is driven in a low voltage region, and the transistor element for drive is required to output a large current with several volts. In the case of the organic EL element, a large current can be obtained when the applied voltage is made high, and the luminescence with high intensity can be realized, however the degradation or decomposition of the materials for the luminescent element occurs to shorten the life time of the element and the long-term stable luminescence cannot be conducted. Thus, the driving voltage is about 1 to about 20 V, more preferably 5V or less. In this case, the current density value modulated by the transistor element in a low voltage region is not particularly limited, however 1 mA/cm$^2$ to 500 mA/cm$^2$ is preferable, and more preferably 10 mA/cm$^2$ to 200 mA/cm$^2$. In the case where the transistor element of the present invention is utilized as a luminescent element, when the current density value is less than 1 mA/cm$^2$, it is not possible to allow the luminescent element to sufficiently emit luminescence and sufficient luminescent intensity cannot be obtained. Moreover, with the element having a current density value of exceeding 500 mA/cm$^2$, the sufficient ON/OFF ratio cannot be obtained, and it sometimes occurs the problem that the dark current is generated even during the OFF time (the voltage is 0 V) to occur luminescence from the luminescent element.

Examples of the use application of the transistor element of the present invention include a switching element and a current amplifying element, and when the modulated collector current $I_C$ is 10 mA/cm$^2$ or more, the transistor element of the present invention can be utilized as an element for driving, in particular, an organic EL device or the like, or a switching element that is driven with a low current. Furthermore, when the current amplification factor is 50 or more, the transistor element of the present invention is effective as an element for amplifying an analog signal that is driven with a low current, and when the ON/OFF ratio is 50 or more, the transistor element of the present invention is effective as a switching element that can be driven with a small input current. Thus, a transistor element having a collector current $I_{C-ON}$ of 10 mA/cm$^2$ or more; exhibiting a current modulation property that an ON/OFF ratio ($I_{C-ON}/I_{C-OFF}$) being a ratio of the collector current $I_{C-ON}$ to the ratio of the collector current $I_{C-OFF}$ flowing by applying the voltage ($V_C$) between the emitter electrode and the collector electrode without applying the voltage ($V_B$) between the emitter electrode and the base electrode of 50 or more; and furthermore a current amplification factor of the modulated collector current $I_C$ of 50 or more becomes an excellent transistor element that is applicable to various types of use application.

The p-type organic semiconductor layer of the transistor element of the present invention forms a thin film structure comprising a hole-transporting material and therefore has an advantage from the viewpoint of production that a wide variety of p-type organic semiconductor materials are applicable. That is, in the present invention, a material that constitutes the collector layer may be a material that can efficiently transport holes, and a material that can form the p-type organic semiconductor layer can be used without problem. That is, in the present invention, the organic semiconductor material that is used for the formation of the p-type organic semiconductor layer may be a material that transports holes (hole-transporting material), and the collector layer that is formed from such a material, the collector layer obtained by laminating the p-type organic semiconductor layers each having a different HOMO level can be used without particular limitation. An element excellent in ON/OFF ratio or current amplification factor can be made depending on the material that forms the collector layer and the emitter layer or the formation method, so that an appropriate organic semiconductor material can be selected depending on the use application.

It is desirable that the organic semiconductor film that constitutes the transistor element of the present invention have an appropriate energy level. Therefore, as the suitable constitution of the present invention, it is preferable that the p-type organic semiconductor layer (collector layer) that is provided between the base electrode and the collector electrode comprises a p-type organic semiconductor layer having a HOMO level (energy level of the highest occupied molecular orbital) between 4.5 to 6.0 eV. Moreover, the HOMO level (energy level of the highest occupied molecular orbital) of the organic semiconductor material that forms the emitter layer is not particularly limited, however according to the study made by the present inventors, in the case where the emitter layer and the collector layer are formed so that the HOMO level of the emitter layer falls within a range between 4.5 to 6.0 eV, namely the HOMO layer of the emitter layer falls within the range that the HOMO level of the emitter layer is the same as the HOMO level of the collector layer or that the HOMO level of the emitter layer is greater than the HOMO level (HOMO level having a lower energy) of the collector layer, the holes injected from the emitter layer can be transferred to the collector electrode more efficiently due to the difference between the HOMO levels, and, as a result thereof, a larger current can be obtained. However, in the case where the collector layer is formed so as to have a multi-layered structure from different organic semiconductor materials, the organic semiconductor materials can be selected so that the HOMO level of the organic semiconductor layer that is formed so as to be adjacent to the collector electrode has the same HOMO level as the emitter layer or has a smaller HOMO level (HOMO level having a higher energy) than the emitter layer.

Holes are efficiently injected from the emitter layer into the collector layer that constitutes the transistor element of the present invention, and examples of the p-type organic semiconductor material that forms the collector layer include pentacene, diindenoperylene (DIP), dinaphthothienothiophene (DNTT), metallophthalocyanines, metal-free phthalocyanines, and poly(3-hexyl)thiophene (P3HT) The HOMO energy levels for these materials measured by a photoelectron spectrometer (AC-3: manufactured by Riken Keiki Co., Ltd., the same apparatus is used for the measurement of a HOMO energy level) in the atmospheric air are 5.22 eV for pentacene, 5.49 eV for DIP, 5.49 eV for DNTT, 5.15 eV for copper phthalocyanine, 5.23 eV for Ni phthalocyanine, and 4.80 eV for P3HT, respectively. Therefore, in every case where any of these materials is used, holes that can efficiently be injected from the emitter layer can efficiently be transferred to the collector electrode side collector layer described later, and a large current can be obtained.

The emitter layer that constitutes the transistor element of the present invention is a thin film of an organic semiconductor formed from the p-type organic semiconductor. A material that forms the emitter layer may be a material that can efficiently transport holes, and a material that can form the p-type organic semiconductor layer can be used without problem. The organic semiconductor material that is used for the formation of the p-type organic semiconductor layer works as a hole-transporting type semiconductor, and, as a material that is used, a material that transports holes (hole-transporting material) can be used without particular limitation.

It is preferable that the emitter layer that constitutes the transistor element of the present invention has an appropriate energy level. Since the holes injected from the emitter electrode is transferred to the interface of the base electrode and further are injected through the base electrode into the collector layer, a material having a HOMO level (energy level of the highest occupied molecular orbital) at which energy level the holes are efficiently injected from the base electrode and are easily injected into the collector layer is preferable as a forming material for the emitter layer. Specifically, an organic semiconductor material having a HOMO level between 4.5 to 6.0 eV is preferable, and the emitter layer comprising such a material is made, the injected holes can efficiently be transferred through the base electrode to the collector layer and a larger current can be obtained. As a specific forming material that constitutes the emitter layer, compounds or derivatives thereof with which the injection of holes from the base electrode can efficiently be conducted and holes are easily injected, that is, compounds or the derivatives thereof such as, for example, pentacene, metal-free phthalocyanines, metallophthalocyanines, dinaphthothienothiophene, diindenoperylene, poly(3-hexyl)thiophene (P3HT) can be utilized. More details will be described later. Moreover, as will be described later, the charge injection from the emitter electrode to the organic semiconductor layer can be conducted more efficiently by taking an embodiment in which the hole injection layer is formed between the emitter electrode and the organic semiconductor layer.

Regarding the particularly preferable method for forming the p-type organic semiconductor layer, the description is made by taking P3HT that is a suitable material as an example. Poly(3-hexyl)thiophene (P3HT) that is used in this case can be used by mixing another p-type organic semiconductor polymer, however in order to obtain a more sufficient transistor property, it is preferable that P3HT is contained more than 50 mass %. Specific examples of the method for forming the p-type organic semiconductor layer include simple methods such as a method in which any of the above-described polymer materials is dissolved or dispersed in a solvent such as toluene, chloroform, dichloromethane, tetrahydrofuran, and dioxane to prepare a coating liquid and then coating or printing is conducted with the solution or dispersion liquid by a coating apparatus or the like, and the p-type organic semiconductor layer can easily be formed by any of these methods.

As described previously, the current transmission promotion layer that constitutes the transistor element of the present invention and characterizes the present invention is formed so that the current transmission promotion layer and the base electrode form a laminated structure. As a forming material for the current transmission promotion layer, a material that enhances the current transmittance rate by increasing the charges (holes) that transmit the base electrode can be used without problem. As a specific forming material for the current transmission promotion layer, alkali metal compounds or alkaline earth metal compounds that are known to date can preferably be utilized, however examples of the particularly preferable material include lithium fluoride. These materials have an effect of reducing contact resistance at the interface between the electrode and the organic semiconductor layer with the work function of the materials being small. Moreover, the diffusion of a metal that constitutes the base electrode to the p-type organic semiconductor layer can be suppressed by forming the current transmission promotion layer on each of the surface and back sides of the base electrode, and therefore the transistor element of the present invention becomes an element excellent in stability with a scarce change in element properties over a long period of time. On the other hand, in the case where the current transmission promotion layer is not formed or the current transmission promotion layer is formed on only one side of the surface and back sides of the base electrode, when the transistor element is driven over a long period of time, the material for the base electrode diffuses to the p-type organic semiconductor layer, and there is a possibility that the lowering of the element performance is gradually brought about. Furthermore, in the case where the p-type organic semiconductor layer is formed by a printing method, coating method, and so on using a solution of an organic semiconductor material in the transistor element of the present invention, laminating of the elements can be conducted by preventing corrosion or redissolution of the organic semiconductor layer or electrode layer already formed, and therefore it becomes possible to prepare an element having further more stable performance.

As described previously, in the transistor element of the present invention, a hole injection layer can further be provided as necessary for the purpose of reducing the barrier for injecting holes from the electrode into the organic semiconductor layer and increasing the current that flows in the p-type organic semiconductor layer sandwiched by the electrodes. The charges (holes) get to be efficiently injected from the emitter electrode into the emitter layer by forming the hole injection layer at the interface of the organic semiconductor layer. As a forming material for the hole injection layer in this case, a material that promotes hole injection from the electrode into the organic semiconductor layer can be used without problem. Specifically, the materials listed previously may be used, and examples of the particularly preferable material include a hole injection layer formed by molybdenum oxide.

Furthermore, the transistor element of the present invention can make fine patterning of the base electrode such as the conventional SIT structure unnecessary, can conduct large current modulation with a low voltage, and further makes it possible to obtain a light emitting transistor element having a high ON/OFF ratio. Moreover, the transistor element of the present invention can be prepared by a vapor deposition method alone, therefore it is possible to form an element on a flexible substrate such as plastics, and it becomes possible to simply produce a practical light emitting transistor element comprising a small, light-weighted, and simple structure. Moreover, in the transistor element of the present invention, it is possible to make the collector layer so as to have a light emitting element part including a light emitting layer being an organic EL, and further the light emitting element part becomes a light emitting transistor element having a light emitting element part comprising one or 2 or more layers selected from a hole injection layer, a hole-transporting layer, an electron-transporting layer, and an electron injection layer.

Next, each structure and each material of the transistor element of the present invention are described.

(Substrate)

The organic transistor element of the present invention is usually used by being formed on the substrate as listed below. The substrate that is used in this case may be a material capable of retaining the form of the transistor element, and, for example, inorganic materials such as glass, alumina, quartz, and silicon carbide; metal materials such as aluminum, copper, and gold; and plastic substrates such as a polyimide film, a polyester film, a polyethylene film, polystyrene, polypropylene, polycarbonate, and polymethylmethacrylate can be used. In the case where the plastic substrate is used, a flexible transistor element that is light-weighted and is excellent in shock resistance can be prepared. Moreover, in the case where the organic transistor element is utilized as a light emitting transistor element in which an organic light emitting layer is formed and that the light is emitted from the substrate side, namely in the case of bottom emission, it is preferable to use a substrate having a high light transmittance such as a plastic film or glass. The above-described substrates may be used alone or in combination of two or more kinds. Moreover, regarding the sizes or forms of the substrate, any of the forms such as card-like, film-like, disk-like, tip-like forms, and so on can be used without problem as long as the formation of the transistor element can be conducted.

(Organic Semiconductor Layer)

Figure 2:
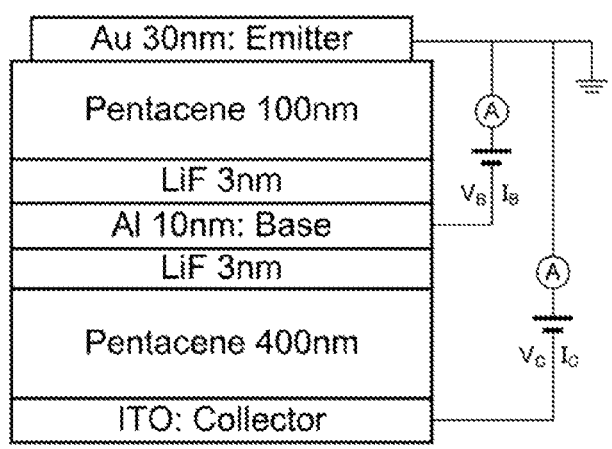
FIG. 2 is a diagram illustrating the constitution of a transistor element of Example 8 of the present invention.

As described previously, the characteristic of the organic transistor element of the present invention is that the p-type organic semiconductor layer that constitutes the organic transistor element comprises, as illustrated in FIG. 1, the collector layer 21 provided between the collector electrode and the base electrode and the emitter layer 22 formed between the base electrode and the emitter electrode, and, in addition, the base electrode, and the collector layer and emitter layer that are the p-type organic semiconductor layer are made in a laminated state through the current transmission promotion layers (see, FIGS. 1 and 2). Hereinafter, the p-type organic semiconductor layer is described in terms of the emitter layer and the collector layer separately.

<Emitter Layer>

The emitter layer 22 that constitutes the organic transistor element of the present invention comprises the p-type organic semiconductor, and as a forming material for the emitter layer, a material that transports holes can be used without problem. Moreover, the emitter layer of the present invention may be made so as to form a multi-layered structure with another p-type organic semiconductor layer, may be made so as to form a diode structure with an n-type organic semiconductor layer, or may be made so as to form a laminated structure with a hole injection layer, as necessary.

The p-type organic semiconductor layer essential for the emitter layer that constitutes the present invention has a function of receiving holes from the emitter electrode and transporting the holes to the base electrode, or, depending on the circumstance, to the n-type organic semiconductor layer that is paired with the p-type organic semiconductor layer or to near the interface of the n-type organic semiconductor. As a material that forms the p-type organic semiconductor layer, a general p-type organic semiconductor material can be used without particular limitation, and, for example, pentacene, metal-free phthalocyanines, metal phthalocyanines (such as Cu-Pc, VO-Pc, and Ni-Pc), naphthalocyanines, indigo, thioindigo, anthracene, quinacridone, oxadiazoles, triphenylamines, triazoles, imidazoles, imidazolones, pyrazolines, tetrahydroimidazoles, polythiophenes, porphyrins, dinaphthothiophenes, diindenoperylene, poly(3-hexyl)thiophene (P3HT), and so on, or derivatives thereof can be used. Moreover, hole-transporting materials that function as a p-type organic semiconductor material in addition to the p-type organic semiconductor materials listed above can also be utilized for the purpose of forming the emitter layer.

As the p-type semiconductor material that forms the emitter layer that constitutes the organic transistor element of the present invention, an organic semiconductor material that is electrically stable, has appropriate ionization potential and electron affinity, and further has a HOMO level between 4.5 to 6.0 eV is preferable, and furthermore it is more preferable that the organic semiconductor material has the same HOMO level as or a larger HOMO level (HOMO level having a lower energy) than that of the base electrode side collector layer. Examples of the particularly preferable material for the p-type semiconductor layer that forms the emitter layer include pentacene, copper phthalocyanine, dinaphthothienothiophene, diindenoperylene, poly(3-hexyl)thiophene (P3HT). Moreover, examples of derivatives in this case include compounds having a functional group such as an alkyl group such as a methyl group, an ethyl group, a butyl group, a 2-ethylhexyl group, an octyl group, a dodecyl group, and an octadecyl group; a heteroalkyl group having a hetero group in the alkyl group; an amino group; an amide group; and a carboxyl group. According to the study made by the present inventors, it is more preferable that the p-type semiconductor material has the above functional group because the solubility to the solvent is increased, and as a result thereof it becomes possible to apply a printing method in forming the p-type organic semiconductor layer, it becomes possible to easily form a smooth semiconductor surface, and, in addition, the charge transmission property may be improved due to the interaction of functional groups. The thin film (layer) of the p-type organic semiconductor comprising any of the above-described materials can be formed by a single material of the above described materials, however the p-type organic semiconductor layer may be made as a mixed layer formed from a mixed material comprising two or more components. Furthermore, the p-type organic semiconductor layer may have a laminated structure comprising two or more different p-type organic semiconductor layers.

However, as the material that forms the p-type semiconductor layer of the emitter layer, a substance in which the hole-transporting property is higher than the electron-transporting property may also be used even though the substance is other than the above-described materials. In addition, the p-type semiconductor layer in this case may be not only a single-layered structure using a single component but also a mixed layer comprising two or more components or a laminated structure comprising two or more organic semiconductor layers. As a method for forming the p-type organic semiconductor layer, a vapor deposition method, or various types of printing methods or coating methods using a solution or a dispersion liquid containing any of the above-described materials can be used to form the p-type organic semiconductor layer.

It is desirable that the charge mobility of the p-type organic semiconductor layer forming the emitter layer that constitutes the organic transistor element of the present invention be high, and it is preferable that the charge mobility is at least 0.0001 cm$^2$/V·s. Moreover, it is preferable the thickness of the emitter layer 22 is basically thinner than the thickness of the collector layer, and the thickness of the emitter layer is 300 nm or less, preferably about 10 nm to about 300 nm. It is not preferable that the thickness of the emitter layer is less than 10 nm because there is a possibility that a diode structure is not formed at some parts and thereby the lowering of the transistor performance or the lowering of yield due to the occurrence of a problem of conduction is considered. On the other hand, it is not preferable that the thickness of the emitter layer exceeds 300 nm because a problem of increasing the production cost and the material cost occurs.

<Collector Layer>

The collector layer that constitutes the organic transistor element of the present invention is formed from the p-type organic semiconductor material so as to form a laminated structure through the current transmission promotion layer between the base electrode and the collector electrode. And examples of the material that forms the collector layer include p-type organic semiconductor materials that are usually used as an organic semiconductor, and any of such p-type organic semiconductor materials can be used. The p-type organic semiconductor material that transports holes can be used without particular limitation, the p-type organic semiconductor materials that are generally used can be used, and any of the p-type organic semiconductor materials that are used for the emitter layer and described previously can be utilized.

As the material that forms the collector layer that constitutes the organic transistor element of the present invention, a material can be used without particular limitation as long as the material is a p-type semiconductor material. It is preferable that the collector layer is a p-type organic semiconductor layer comprising a material having a HOMO level (energy level of the highest occupied molecular orbital) in a range between 4.5 to 6.0 eV, and it is more preferable that the collect layer is a layer comprising, among the materials having a HOMO level in the range, particularly poly(3-hexyl)thiophene (P3HT), pentacene, diindenoperylene, and dinaphthothienothiophene, and derivatives thereof. Moreover, examples of the derivatives in this case include compounds having a functional group such as an alkyl group such as a methyl group, an ethyl group, a butyl group, a 2-ethylhexyl group, an octyl group, a dodecyl group, an octadecyl group; a heteroalkyl group having a hetero group in the alkyl group; an amino group; an amide group; and a carboxyl group. According to the study made by the present inventors, it is more preferable that the p-type organic semiconductor material has any of the above functional groups because the solubility to the solvent is increased, as a result thereof it becomes possible to apply a printing method in forming the p-type organic semiconductor layer, and the charge transmission property may be improved due to the interaction of functional groups. The p-type organic semiconductor layer comprising any of the above described materials can be formed using a single material of the above described materials, however the p-type organic semiconductor layer may be made as a mixed layer formed from a mixed material comprising two or more components. Furthermore, the collector layer that constitutes the organic transistor element of the present invention may have at least one p-type organic semiconductor layer, however the collector layer may have a laminated structure comprising two or more different p-type organic semiconductor layers, or furthermore may have a laminated structure in which another organic semiconductor layer is further laminated.

Moreover, the film thickness of the collector layer that constitutes the organic semiconductor element of the present invention is usually 50 nm to 5,000 nm, however it is preferable that the film thickness of the collector layer is about 100 nm to about 500 nm. In addition, it is not preferable that the thickness of the collector layer is less than 50 nm because there is a risk that the organic transistor element of the present invention does not operate as a transistor element, and on the other hand it is not preferable that the thickness of the collector layer exceeds 5,000 nm because a problem of increasing the production cost and the material cost occurs.

However, it is desirable that the charge mobility of the collector layer be high, and it is preferable that the charge mobility of the collector layer is 0.0001 cm$^2$/V·s or more. It is not preferable that the charge mobility is low because there is a risk that a problem, for example, that the ON current, which represents the performance as a transistor element, becomes small occurs.

(Electrode)

The electrode that is used for the transistor element of the present invention is described. The electrode that constitutes the transistor element of the present invention includes the collector electrode 11, the emitter electrode 12, and the base electrode 13, and, as illustrated in FIG. 1, the collector electrode 11 is provided on the substrate 10, the base electrode 13 is provided so as to be embedded between the emitter layer 22 being a p-type organic semiconductor layer and the collector layer 21 having a laminated structure, and the emitter electrode 12 is provided at a position opposed to the collector electrode 11 so as to put the p-type organic semiconductor layers 21 and 22 and the base electrode 13 between the collector electrode 11 and the emitter electrode 12.

It is preferable that the material that is used for each electrode that constitutes the transistor element of the present invention is a compound described below. For example, the collector layer 21 that constitutes the transistor element of the present invention is a p-type semiconductor layer comprising a p-type organic semiconductor, and therefore examples of the forming material for the collector electrode 11 include transparent conductive films such as ITO (indium tin oxide), indium oxide, IZO (indium zinc oxide), SnO$_2$, and ZnO; a metal such as gold, silver, and copper; and electroconductive polymers such as polyaniline, polypyrrole, polyalkylthiophene derivatives, and polysilane derivatives. On the other hand, examples of the forming material for the emitter electrode 12 include metal simple substances such as Al (aluminum) and Ag (silver), magnesium alloys such as Mg—Ag and Mg—In; aluminum alloys such as Al—Li, Al—Ca, and Al—Mg; alkali metals including Li and Ca; and metals having a small work function such as alloys of alkali metals.

Moreover, in the present invention, using, as abase electrode that suppresses the dark current during the OFF time and achieves a high ON/OFF ratio, a base electrode obtained by forming an electrode from aluminum and then applying thermal oxidation processing in the air to thereby form an oxidized film on the surface of the electrode is also a preferable embodiment, and it becomes possible to form a transistor element: that has a large ON current; in which the dark current is suppressed; and that has a high ON/OFF ratio.

The embodiment of the base electrode that is used for the transistor element of the present invention is sheet-like, therefore the formation is easy, and the base electrode is formed by a vacuum process such as vacuum deposition, spattering, and CVD or a coating method or the like. Moreover, since the base electrode is formed on the collector layer through the current transmission promotion layer, there hardly occurs a failure or defect of the electrode, and there hardly occurs that it becomes difficult for charges to transmit the base electrode without being accelerated by voltage at a portion where the failure or defect occurs. It is preferable that the thickness of the base electrode that is formed is 0.5 nm to 100 nm, more preferably 1 nm to 30 nm, further more preferably 5 nm to 20 nm. When the thickness of the base electrode is 100 nm or less, the base electrode can easily transmit the electrons accelerated by the base voltage $V_B$. In addition, the base electrode can be used without problem as long as the base electrode is provided in the semiconductor layer without a discontinuous portion (namely, without a failure portion such as a hole or crack), however it is not preferable that the thickness of the base electrode is less than 0.5 nm because a failure occurs and there is a risk that the transistor element does not operate as a transistor element.

With regard to the collector electrode and the emitter electrode among the above respective electrodes, a vacuum process such as vacuum deposition, spattering, and CVD or a coating process can be used as the method for forming an electrode that is used for the transistor element of the present invention. It is preferable that the electrode formed by these methods has a film thickness of, for example, about 10 nm to about 1,000 nm depending on the material that is used. In addition, it is not preferable that the thickness of the electrode is less than 10 nm because the transistor element does not operate as a transistor element, and it is also not preferable that the thickness of the electrode exceeds 1,000 nm that the production cost and the material cost become high.

(Current Transmission Promotion Layer)

In the transistor element of the present invention, the current transmission promotion layer is formed on each of the surface and back sides of the base electrode, and in this case, the base electrode part is made so as to form a laminated structure of the current transmission promotion layers and the electrode. A forming material for the current transmission promotion layer can be used without problem as long as the forming material is a current transmission promotion material because the laminated current transmission promotion layers may function as a layer that increases the current transmittance. Specifically, a material that has been known so far as an electron injection layer can be utilized as a material for the current transmission promotion layer, and, for example, an alkali metal compound or a material containing an alkali metal compound can preferably be utilized. Preferably, the forming material for the current transmission promotion layer is constituted from a compound such as a halide of lithium, sodium, potassium, and rubidium each having small ionization tendency; or a halide of an alkaline earth metal such as magnesium, calcium, barium, and strontium; or mixtures of these halides. Particularly preferable examples include a lithium fluoride layer. In addition, the compound that forms the current transmission promotion layer can be used by mixing with a conductive material, semiconductor material, or insulating material. It is preferable that the film thickness of the current transmission promotion layer is 0.1 nm to 10 nm. Even if the thickness of the current transmission promotion layer is 10 nm or less, the injection of holes can sufficiently be conducted in the current transmission promotion layer and a large rise in the current can be obtained. On the other hand, when the thickness of the current transmission promotion layer is larger than 10 nm, the current transmission promotion layer works as an insulator, not only the base current is suppressed but also the collector current is considerably reduced to lower the performance as a transistor element, and therefore it is hard to say that the thickness of the current transmission promotion layer of more than 10 nm is the optimum thickness. On the other hand, it is not preferable that the film thickness is less than 0.1 nm because the film thickness is too thin, thereby the effect becomes small, the dark current becomes large to lower the performance of the element, and further it becomes difficult to prepare an element having stable performance. Furthermore preferably, according to the study made by the present inventors, it is more preferable that the current transmission promotion layers are formed so that the emitter layer side current transmission promotion layer has a thickness of 0.1 to 10 nm and the collector layer side current transmission promotion layer has a thickness of 0.1 to 5 nm because not only a large collector current value can be obtained but also the transistor element of the present invention becomes an element in which the current amplification factor is large and with which a large current is obtained.

(Hole Injection Layer)

Moreover, in another embodiment of the transistor element of the present invention, a hole injection layer is formed at an interface of the electrode and the organic semiconductor layer. By making such constitution, the injection barrier from the electrode to the organic semiconductor layer is reduced, and it becomes possible to efficiently inject charges (holes) from the emitter electrode to the emitter layer. Examples of the forming material for the hole injection layer between the emitter electrode and the emitter layer include porphyrins, phenylamines, starburst type amines, phthalocyanines; metal oxides such as vanadium oxide, molybdenum oxide, ruthenium oxide and aluminum oxide; amorphous carbon, polyaniline, and derivatives of polythiophene.

The method for forming a hole injection layer that is used for the transistor element of the present invention include a vacuum process such as vacuum deposition, spattering, and CVD or a coating method. It is preferable that the hole injection layer that is formed by these methods has a film thickness of, for example, about 0.1 nm to about 50 nm depending on the material that is used. In addition, it is not preferable that the thickness of the hole injection layer is less than 0.1 nm because there is a risk that the transistor element of the present invention does not stably operate as a transistor element, and it is also not preferable that the thickness of the hole injection layer exceeds 50 nm, not only the production cost and the material cost become high but also there is a possibility that the current is reduced due to the insulation property of the material.

(Dark Current Suppression Layer)

In the transistor element of the present invention, a dark current suppression layer may further be formed as described below. As the method for forming the dark current suppression layer, it is preferable to form the base electrode and thereafter apply heat processing to the base electrode. Furthermore, the transistor element of the present invention becomes a transistor element in which the dark current that flows in the case where the voltage $V_B$ is not applied between the emitter electrode and the base electrode can effectively be suppressed by making the base electrode so as to comprise a metal and forming an oxidized film of the base electrode on one face or both faces of the base electrode.

Moreover, it is also preferable to use, as a base electrode that suppresses the dark current during the OFF time and achieves a high ON/OFF ratio, a base electrode obtained by forming an electrode from aluminum and applying thermal oxidation in the air to form a dark current suppression layer comprising an aluminum oxide film on the surface of the electrode. Moreover, it becomes possible to form a transistor element that has a large ON current; in which the dark current is suppressed; and that has a high ON/OFF ratio by using the electrode having a layered structure comprising lithium fluoride layer/aluminum electrode layer/lithium fluoride layer as a base electrode.

According to the transistor element of the above-described embodiments of the present invention, the dark current can effectively be suppressed from flowing by the dark current suppression layer being provided between the collector electrode and the base electrode, and, as a result thereof, the ON/OFF ratio can be increased more. The transistor element constituted as such effectively functions as a current modulation type transistor element apparently similar to a bipolar transistor, and becomes a transistor element that functions as an excellent organic transistor element exhibiting a high ON/OFF ratio, and a large collector current and current amplification factor.

EXAMPLES

Hereinafter, the present invention will be described in detail giving Examples and Comparative Examples, however the present invention is not limited to these Examples.

(Evaluation of Transistor Element)

First of all, a method for evaluating transistor elements prepared in Examples and Comparative Examples is described. In the present invention, the evaluation of the transistor elements were conducted by the following method.

To each transistor element that was prepared, the applied voltage ($V_C$) was applied between the emitter electrode and the collector electrode under a common emitter condition, and the base voltage ($V_B$) that was applied between the emitter electrode and the base electrode was modulated in the range from 0 V to −5 V. Regarding the measurement of an output modulation property, the base current $I_B$ and the amount of change in the collector current $I_C$ (OFF current and On current) were measured when the collector voltage ($V_C$) was applied between the emitter electrode and the collector electrode, and further the base voltage $V_B$ (0 V to −3 V) was applied between the emitter electrode and the base electrode. Then, from these measured values, the ratio of the change in the collector current (output property) to the change in the base current (input property), namely the current amplification factor (hFE), and the ON/OFF ratio ($I_{C-ON}/I_{C-OFF}$) being the ratio of the ON current to the OFF ratio were calculated.

Example 1

[Current Transmission Promotion Layer: Collector Layer Side Thickness 1 nm/Emitter Layer Side Thickness 3 nm]

Head-to-tail P3HT [regioregular-Poly(3-hexylthiophene-2,5-diyl)] was dissolved in toluene, and a P3HT solution was prepared so that the concentration became 20 mg/mL. The obtained P3HT solution was applied on an ITO transparent substrate by a spin coater to form a collector layer (250 nm). Next, a current transmission promotion layer comprising lithium fluoride (LiF), the current transmission promotion layer having a thickness of 1.0 nm was formed thereon, and further a base electrode layer comprising aluminum, the base electrode layer having an average thickness of 10 nm was formed by a vacuum deposition method. Thereafter, heat treatment was conducted at 150° C. under the atmospheric pressure for 1 hour to form an oxidized film layer (dark current suppression layer) on the surface of the aluminum electrode. Next, a current transmission promotion layer comprising lithium fluoride (LiF), the current transmission promotion layer having a thickness of 3.0 nm was formed on the oxidized film layer, and then an emitter layer (100 nm) comprising copper phthalocyanine was formed by the vacuum deposition method. Next, an emitter electrode comprising gold, the emitter electrode having an average thickness of 30 nm was formed by film forming means of the vacuum deposition method to obtain a transistor element of Example 1. The obtained element exhibited the current modulation being a characteristic of an MBOT.

The evaluation of the output properties for the transistor element of Example 1 obtained as described above was conducted by measuring the changes in the collector current $I_C$ and the base current $I_B$ when a collector voltage $V_C$ of −5 V was applied between the emitter electrode and the collector electrode, and further the base voltage $V_B$ was applied and not applied between the emitter electrode and the base electrode (0 V to −3 V). As a result thereof, when a collector voltage $V_C$ of −5 V and a base voltage $V_B$ of −3.0 V were applied, the transistor element had an ON current density $I_{C-ON}$ of the collector current $I_C$ of −1.00 mA/cm$^2$; and an ON current density $I_{B-ON}$ of the base current $I_B$ of −0.04 mA/cm$^2$, and when $V_B$=0 V, the transistor element had an OFF current density $I_{C-OFF}$ of the collector current $I_C$ of −1×10$^{-6}$ mA/cm$^2$; and an OFF current density $I_{B-OFF}$ of the base current $I_B$ of 0.0005 mA/cm$^2$, further the ON/OFF ratio was 8721, and the current amplification factor was 26.7.

Example 2

[Current Transmission Promotion Layer: Collector Layer Side Thickness 0.6 nm/Emitter Layer Side Thickness 1 nm]

Head-to-tail P3HT [regioregular-Poly(3-hexylthiophene-2,5-diyl)] was dissolved in toluene, and a P3HT solution was prepared so that the concentration became 20 mg/mL. The obtained P3HT solution was applied on an ITO transparent substrate by a spin coater to form a collector layer (250 nm). Next, a current transmission promotion layer comprising lithium fluoride (LiF), the current transmission promotion layer having a thickness of 0.6 nm was formed thereon, and further a base electrode layer comprising aluminum, the base electrode layer having an average thickness of 10 nm was formed by the vacuum deposition method. Thereafter, heat treatment was conducted at 150° C. under the atmospheric pressure for 1 hour to form an oxidized film layer (dark current suppression layer) on the surface of the aluminum electrode. Next, a current transmission promotion layer comprising lithium fluoride (LiF), the current transmission promotion layer having a thickness of 1.0 nm was formed on the dark current suppression layer, and then an emitter layer (100 nm) comprising copper phthalocyanine was formed by the vacuum deposition method. Next, a molybdenum oxide layer (hole injection layer) was formed by the vacuum deposition method so that the average film thickness became 2 nm, and an emitter electrode comprising gold, the emitter electrode having an average thickness of 30 nm was formed by film forming means of the vacuum deposition method to obtain a transistor element of Example 2. The obtained element exhibited the current modulation being a characteristic of an MBOT.

The evaluation of the output properties for the transistor element of Example 2 obtained as described above was conducted by measuring the changes in the collector current $I_C$ and the base current $I_B$ when a collector voltage $V_C$ of −5 V was applied between the emitter electrode and the collector electrode, and further the base voltage $V_B$ was applied and not applied between the emitter electrode and the base electrode (0 V to −3 V). As a result thereof, when a collector voltage $V_C$ of −5 V and a base voltage $V_B$ of −3.0 V were applied, the transistor element had an ON current density $I_{C-ON}$ of the collector current $I_C$ of −45.38 mA/cm², and when $V_B$=0 V, the transistor element had an OFF current density $I_{C-OFF}$ of −0.077 mA/cm², further the ON/OFF ratio was 560, and the current amplification factor was 5.5.

Example 3

[Current Transmission Promotion Layer: Collector Layer Side Thickness 0.6 nm/Emitter Layer Side Thickness 3 nm]

Head-to-tail P3HT [regioregular-Poly(3-hexylthiophene-2,5-diyl)] was dissolved in toluene, and a P3HT solution was prepared so that the concentration became 20 mg/mL. The obtained P3HT solution was applied on an ITO transparent substrate by a spin coater to form a collector layer (250 nm). Next, a current transmission promotion layer comprising lithium fluoride (LiF), the current transmission promotion layer having a thickness of 0.6 nm was formed thereon, and further a base electrode layer comprising aluminum, the base electrode layer having an average thickness of 10 nm was formed by the vacuum deposition method. Thereafter, heat treatment was conducted at 150° C. under the atmospheric pressure for 1 hour to form an oxidized film layer (dark current suppression layer) on the surface of the aluminum electrode. Next, a current transmission promotion layer comprising lithium fluoride (LiF), the current transmission promotion layer having a thickness of 3.0 nm was formed on the dark current suppression layer, and then an emitter layer (100 nm) comprising copper phthalocyanine was formed by the vacuum deposition method. Next, a molybdenum oxide layer (hole injection layer) was formed by the vacuum deposition method so that the average film thickness became 2 nm, and an emitter electrode comprising gold, the emitter electrode having an average thickness of 30 nm was formed by film forming means of the vacuum deposition method to obtain a transistor element of Example 3. The obtained element exhibited the current modulation being a characteristic of an MBOT.

The evaluation of the output properties for the transistor element of Example 3 obtained as described above was conducted by measuring the changes in the collector current $I_C$ and the base current $I_B$ when a collector voltage $V_C$ of −5 V was applied between the emitter electrode and the collector electrode, and further the base voltage $V_B$ was applied and not applied between the emitter electrode and the base electrode (0 V to −3 V). As a result thereof, when a collector voltage $V_C$ of −5 V and a base voltage $V_B$ of −3.0 V were applied, the transistor element had an ON current density $I_{C-ON}$ of the collector current $I_C$ of −30.45 mA/cm², and when $V_B$=0 V, the transistor element had an OFF current density $I_{C-OFF}$ of −0.019 mA/cm², further the ON/OFF ratio was 1602, and the current amplification factor was 52.5.

Example 4

[Current Transmission Promotion Layer: Collector Layer Side Thickness 0.6 nm/Emitter Layer Side Thickness 1 nm]

A transistor element of Example 4 was prepared in the same manner as in Example 2 except that the emitter layer of Example 2 was changed from copper phthalocyanine to pentacene. The output properties for the obtained transistor element of Example 4 are shown in Table 2 in the same manner as in the cases of the transistor elements obtained in Examples 1 to 3.

Example 5

[Current Transmission Promotion Layer: Collector Layer Side Thickness 0.6 nm/Emitter Layer Side Thickness 3 nm]

A transistor element of Example 5 was prepared in the same manner as in Example 3 except that the emitter layer of Example 3 was changed from copper phthalocyanine to pentacene. The output properties for the obtained transistor element of Example 5 are shown in Table 2 in the same manner as in the cases of the transistor elements obtained in Examples 1 to 3.

Examples 6 and 7

Transistor elements of Examples 6 and 7 were prepared in the same manner as in Examples 2 and 3 respectively except that the emitter layer of Examples 2 and 3 were changed from copper phthalocyanine to dinaphthothienothiophene (DNTT) respectively. The output properties for the obtained transistor elements of Examples 6 and 7 are shown in Table 2 as with the cases of the transistor elements obtained in Examples 1 to 3.

Example 8

[Current Transmission Promotion Layer: Collector Layer Side Thickness 3 nm/Emitter Layer Side Thickness 3 nm]

An ITO transparent substrate was used as a collector electrode, and a collector layer comprising pentacene being a p-type organic semiconductor material, the collector layer having an average thickness of 400 nm was formed by the vacuum deposition method as a collector electrode side collector layer on the substrate to prepare the collector layer. Next, a current transmission promotion layer comprising lithium fluoride, the current transmission promotion layer having a thickness of 3 nm was formed on the collector layer, and a base electrode layer comprising aluminum, the base electrode layer having an average thickness of 10 nm was formed thereon by the vacuum deposition method. Thereafter, heat treatment was conducted at 150° C. in the atmosphere for 1 hour to form a dark current suppression layer comprising aluminum oxide on the surface of the aluminum electrode. Further, a current transmission promotion layer comprising lithium fluoride, the current transmission promotion layer having a thickness of 3 nm was formed thereon, and thereafter a p-type organic semiconductor layer (average film thickness 100 nm) comprising pentacene was laminated as an emitter layer by the vacuum deposition method. Next, an emitter electrode 12 comprising gold, the emitter electrode 12 having an average thickness of 30 nm was formed thereon by film forming means of the vacuum deposition method to obtain a transistor element of Example 8, the transistor element of Example 8 obtained by laminating respective layers and electrodes in the above-described order.

The evaluation of the output properties for the transistor element of Example 8 obtained as described above was conducted by measuring the changes in the collector current $I_C$ and the base current $I_B$ when a collector voltage $V_C$ of −5 V was applied between the emitter electrode and the collector electrode, and further the base voltage $V_B$ was applied and not applied between the emitter electrode and the base electrode (0 V to −3 V). As a result thereof, when a collector voltage $V_C$ of −5 V and a base voltage $V_B$ of −3.0 V were applied, the transistor element had an ON current density $I_{C-ON}$ of the collector current $I_C$ of −24.9 mA/cm², and when $V_B$=0 V, the transistor element had an OFF current density $I_{C-OFF}$ of −0.384 mA/cm², further the ON/OFF ratio was 64.1, and the current amplification factor was 567.

Example 9

[Current Transmission Promotion Layer: Collector Layer Side Thickness 3 nm/Emitter Layer Side Thickness 3 nm]

An ITO transparent substrate was used as a collector electrode, and a p-type organic semiconductor layer comprising copper phthalocyanine (CuPc) being a p-type organic semiconductor material, the p-type organic semiconductor layer having an average thickness of 350 nm was formed as a collector electrode side collector layer on the substrate by the vacuum deposition method, and further a base electrode side collector layer comprising diindenoperylene (DIP) being a p-type organic semiconductor material, the base electrode side collector layer having an average thickness of 50 nm was formed thereon also by the vacuum deposition method to prepare a collector layer having a structure in which 2 layers each comprising different materials of the above-described materials were laminated. Next, a current transmission promotion layer comprising lithium fluoride, the current transmission promotion layer having a thickness of 3 nm was formed on the collector layer, and a base electrode layer comprising aluminum, the base electrode layer having an average thickness of 10 nm was formed thereon by the vacuum deposition method. Thereafter, heat treatment was conducted at 150° C. in the atmosphere for 1 hour to form a current transmission promotion layer comprising aluminum oxide on the surface of the aluminum electrode. Further, a current transmission promotion layer comprising lithium fluoride, the current transmission promotion layer having a thickness of 3 nm was formed thereon, and thereafter a p-type organic semiconductor layer (average film thickness 100 nm) comprising pentacene was laminated as an emitter layer by the vacuum deposition method. Next, an emitter electrode 12 comprising gold, the emitter electrode 12 having an average thickness of 30 nm was formed thereon by film forming means of the vacuum deposition method to obtain a transistor element of Example 9, the transistor element of Example 9 obtained by laminating respective layers and electrodes in the above-described order.

The evaluation of the output properties for the transistor element of Example 9 obtained as described above was conducted by measuring the changes in the collector current $I_C$ and the base current $I_B$ when a collector voltage $V_C$ of −5 V was applied between the emitter electrode and the collector electrode, and further the base voltage $V_B$ was applied and not applied between the emitter electrode and the base electrode (0 V to −3 V). As a result thereof, when a collector voltage $V_C$ of −5 V and a base voltage $V_B$ of −3.0 V were applied, the transistor element had an ON current density $I_{C-ON}$ of the collector current $I_C$ of −141.2 mA/cm²; and an ON current density $I_{B-ON}$ of the base current $I_B$ of −0.36 mA/cm², and when $V_B$=0 V, the transistor element had an OFF current density $I_{C-OFF}$ of the collector current $I_C$ of −0.035 mA/cm²; and an OFF current density $I_{B-OFF}$ of the base current $I_B$ of 0.003 mA/cm², further the ON/OFF ratio was 4013, the current amplification factor was 394.3, and it was confirmed that the transistor element of Example 9 had extremely excellent properties.

Comparative Example 1

[Current Transmission Promotion Layer: Collector Layer Side not Present/Emitter Layer Side not Present]

Head-to-tail P3HT [regioregular-Poly(3-hexylthiophene-2,5-diyl)] was dissolved in toluene, and a P3HT solution was prepared so that the concentration became 20 mg/mL. The obtained P3HT solution was applied on an ITO transparent substrate by a spin coater to form a collector layer (250 nm). Next, a base electrode layer comprising aluminum, the base electrode layer having an average thickness of 10 nm was formed by the vacuum deposition method. Thereafter, heat treatment was conducted at 150° C. under the atmospheric pressure for 1 hour to form an oxidized film layer (dark current suppression layer) on the surface of the aluminum electrode. And then, an emitter layer (100 nm) comprising copper phthalocyanine was formed by the vacuum deposition method. Next, an emitter electrode comprising gold, the emitter electrode having an average thickness of 30 nm was formed by film forming means of the vacuum deposition method to obtain a transistor element of Comparative Example 1.

The obtained element was evaluated in the same manner as in the case of the element of Example 1. As a result thereof, the transistor element exhibited the current modulation being a characteristic of an MBOT, however the transistor element had an ON current density $I_{C-ON}$ of the collector current $I_C$ of −0.03 mA/cm² and an ON/OFF ratio of 51.8, and the transistor element of Comparative Example 1 was clearly inferior to the elements of Examples.

Comparative Example 2

[Current Transmission Promotion Layer: Collector Layer Side not Present/Emitter Layer Side Thickness 3 nm]

Head-to-tail P3HT [regioregular-Poly(3-hexylthiophene-2,5-diyl)] was dissolved in toluene, and a P3HT solution was prepared so that the concentration became 20 mg/mL. The obtained P3HT solution was applied on an ITO transparent substrate by a spin coater to form a collector layer (250 nm). Next, a base electrode layer comprising aluminum, the base electrode layer having an average thickness of 10 nm was formed by the vacuum deposition method. Thereafter, heat treatment was conducted at 150° C. under the atmospheric pressure for 1 hour to form an oxidized film layer (dark current suppression layer) on the surface of the aluminum electrode. Next, a current transmission promotion layer comprising lithium fluoride (LiF), the current transmission promotion layer having a thickness of 3 nm was formed, and then an emitter layer (100 nm) comprising copper phthalocyanine was formed by the vacuum deposition method. Next, a molybdenum oxide layer (hole injection layer) was formed by the vacuum deposition method so as to have an average film thickness of 2 nm, and an emitter electrode comprising gold, the emitter electrode having an average thickness of 30 nm was formed by film forming means of the vacuum deposition method to obtain a transistor element of Comparative Example 2.

The obtained element was evaluated in the same manner as in the case of the element of Example 1. As a result thereof, the transistor element exhibited the current modulation being a characteristic of an MBOT, however the transistor element had an ON current density $I_{C-ON}$ of the collector current $I_C$ of −0.02 mA/cm², further an ON/OFF ratio of 2.5, and a current amplification factor of 0.74, and the transistor element of Comparative Example 2 was clearly inferior to the elements of Examples.

Comparative Example 3

[Current Transmission Promotion Layer: Collector Layer Side not Present/Emitter Layer Side not Present]

In Example 8, an organic transistor element (MBOT), as a comparative example, not having a lithium fluoride layer on the surface side and the back side of the base electrode was prepared. In the same manner as in Example 8, an ITO transparent substrate was used as a collector electrode, an organic semiconductor layer comprising pentacene being a p-type organic semiconductor material, the organic semiconductor layer having an average thickness of 400 nm was formed on the substrate to prepare a collector layer, and a base electrode layer comprising aluminum, the base electrode layer having an average thickness of 15 nm was formed by the vacuum deposition method. Thereafter, heat treatment was conducted at 150° C. in the atmosphere to form a dielectric layer comprising aluminum oxide on the surface of the aluminum electrode. Further, a p-type organic semiconductor layer (average film thickness 100 nm) comprising pentacene was laminated as an emitter layer by the vacuum deposition method, and then an emitter electrode 12 comprising gold, the emitter electrode 12 having an average thickness of 30 nm was laminated thereon by film forming means of the vacuum deposition method to obtain a transistor element of Comparative Example 3.

The evaluation of the output properties for the transistor element of Comparative Example 3 obtained as described above was conducted by measuring the changes in the collector current $I_C$ and the base current $I_B$ when a collector voltage $V_C$ of $-5$ V was applied between the emitter electrode and the collector electrode, and further the base voltage $V_B$ was applied and not applied between the emitter electrode and the base electrode (0 V to $-3$ V). As a result thereof, when a collector voltage $V_C$ of $-5$ V and a base voltage $V_B$ of $-3.0$ V were applied, the transistor element had an ON current density $I_{C\text{-}ON}$ of the collector current $I_C$ of $-13.54$ mA/cm$^2$, and when $V_B=0$V, the transistor element had an OFF current density $I_{C\text{-}OFF}$ of $-0.067$ mA/cm$^2$, further an ON/OFF ratio of 202, and a current amplification factor of 2.41, and the transistor element of Comparative Example 3 was clearly inferior to the transistor element of Example 8.

(Evaluation Results)

Figure 3:
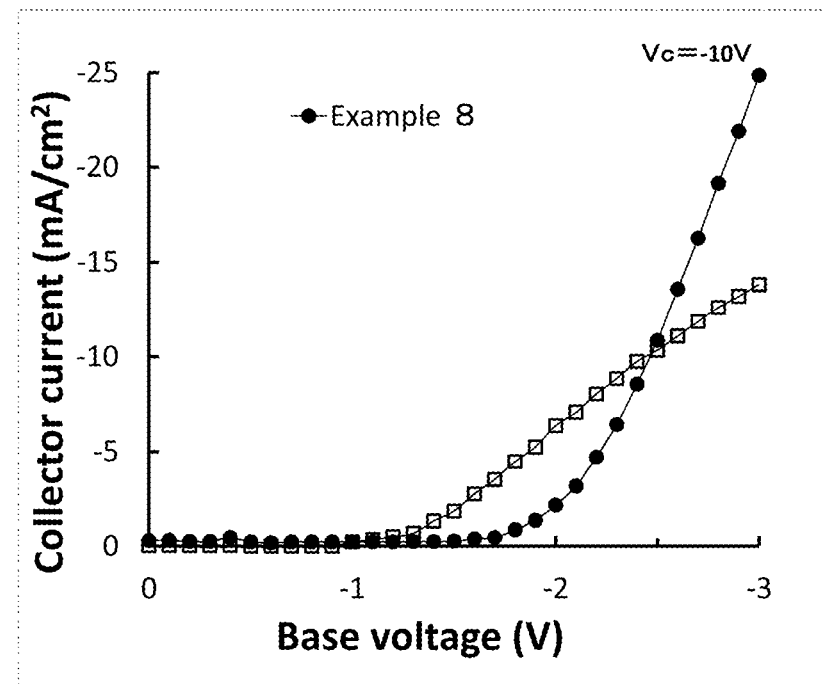
FIG. 3 is a diagram for illustrating an output property ($I_C$-$V_B$ curve) of each transistor element of Example 8 of the present invention and Comparative Example 3.
Figure 4:
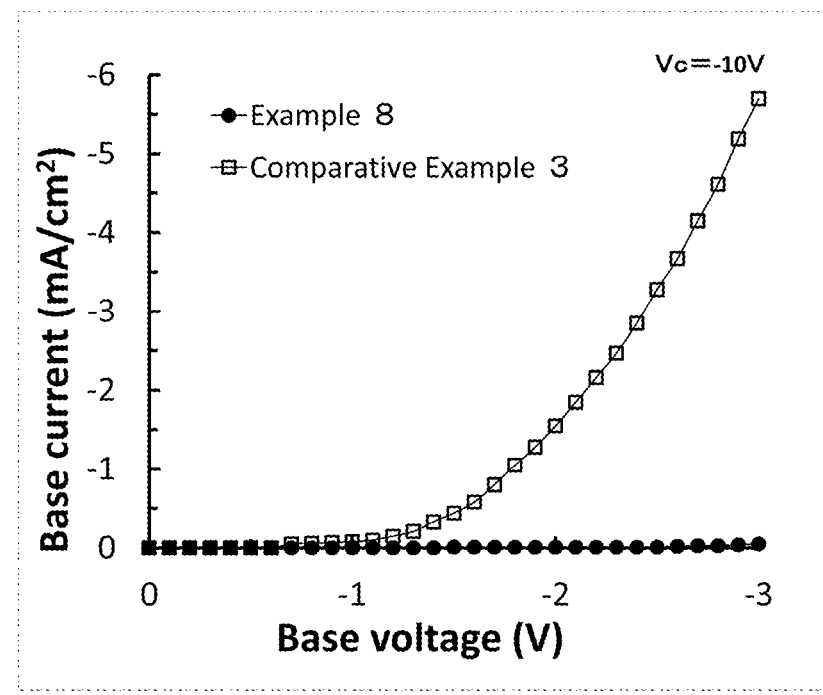
FIG. 4 is a diagram for illustrating an input property ($I_B$-$V_B$ curve) of each transistor element of Example 8 of the present invention and Comparative Example 3.

The transistor properties for each of the transistor elements obtained in Examples 1 to 7 and Comparative Examples 1 and 2 as described above are shown in Tables 1 and 2. The evaluation of the output properties for the transistor elements obtained in Example 8 and Comparative Example 3 was conducted by measuring the changes in the collector current $I_C$ and the base current $I_B$ when a collector voltage $V_C$ of $-5$ V was applied between the emitter electrode and the collector electrode, and further the base voltage $V_B$ was applied and not applied between the emitter electrode and the base electrode (0 V to $-3$ V). Moreover, in each of the transistor elements of Example 8 and Comparative Example 3, the changes in the output property ($I_C$-$V_B$ property) of the collector current $I_C$ and the output property ($I_B$-$V_B$ property) of the base current $I_B$ when a collector voltage $V_C$ of $-10$ V was applied and further the base voltage $V_B$ was applied (0 to $-3$ V) are shown in FIG. 3 and FIG. 4.

TABLE 1

Properties of MBOT ($V_B$ = 0 to $-3$ V, $V_c$ = $-5$ V, Collector Layer P3HT, and Emitter Layer CuPc)

|  | Current transmission promotion layer 31A Thickness (nm) | Current transmission promotion layer 31B Thickness (nm) | ON current density (mA/cm$^2$) | OFF current density (mA/cm$^2$) | Current amplification factor $h_{FE}$ | ON/OFF ratio |
|---|---|---|---|---|---|---|
| Example 1 | 1.0 | 3.0 | $-1.00$ | $-1 \times 10^{-6}$ | 26.7 | 8721 |
| Example 2 | 0.6 | 1.0 | $-45.38$ | $-0.077$ | 5.5 | 560 |
| Example 3 | 0.6 | 3.0 | $-30.45$ | $-0.019$ | 52.5 | 1602 |
| Comparative Example 1 | Not present | Not present | $-0.03$ | $-4.8 \times 10^{-4}$ | 0.006 | 51.8 |
| Comparative Example 2 | Not present | 3.0 | $-0.02$ | $-6 \times 10^{-3}$ | 0.74 | 2.5 |

TABLE 2

Properties of MBOT ($V_B$ = 0 to $-3$ V, $V_c$ = $-5$ V, Collector Layer P3HT, and Emitter Layer Pentacene, DNTT)

|  | Current transmission promotion layer 31A Thickness (nm) | Current transmission promotion layer 31B Thickness (nm) | ON current density (mA/cm$^2$) | OFF current density (mA/cm$^2$) | Current amplification factor $h_{FE}$ | ON/OFF ratio |
|---|---|---|---|---|---|---|
| Example 4 | 0.6 | 1.0 | $-27.8$ | $-1.64 \times 10^{-3}$ | 86.80 | 2427 |
| Example 5 | 0.6 | 3.0 | $-25.8$ | $-1.75 \times 10^{-3}$ | 8.43 | 15521 |
| Example 6 | 0.6 | 1.0 | $-5.25$ | $-2.50 \times 10^{-4}$ | 14.60 | 18562 |
| Example 7 | 0.6 | 3.0 | $-12.50$ | $-1.75 \times 10^{-4}$ | 4.36 | 69370 |

(Evaluation Results)

The evaluation of the output properties for the transistor elements was conducted by measuring the changes in the collector current $I_C$ and the base current $I_B$ when a collector voltage $V_C$ of −5 V was applied between the emitter electrode and the collector electrode, and further the base voltage $V_B$ was applied and not applied between the emitter electrode and the base electrode (0 V to −3 V). The operation as an MBOT was confirmed for any of the transistor elements of Examples. As shown in Tables 1 and 2, it was confirmed from the comparison with the elements of Comparative Examples that excellent current amplification factor, collector current value, and ON/OFF ratio were able to be obtained with the transistor elements of the present invention by providing the current transmission promotion layers on both of the surface side and the back side of the base electrode so as to form a laminated structure. Moreover, it was confirmed from the comparison of Example 1 and Example 3 that more excellent performance was able to be obtained and the transistor property the practical use of which was expected was able to be obtained by laminating a hole injection layer between the emitter electrode and the organic semiconductor layer.

INDUSTRIAL APPLICABILITY

In the organic transistor element of the present invention, the ON current is large, the current amplification factor is high, and a large current can be obtained with the organic transistor element of the present invention, and the organic transistor element of the present invention can be utilized as a switching element; a current amplifying element; and specifically, an element for driving a display such as an organic EL device; and an organic light emitting transistor element in which an organic light emitting layer is incorporated, and the utilization of the organic transistor element of the present invention in various fields is expected.

REFERENCE SIGNS LIST

10: Substrate
11: Collector electrode
12: Emitter electrode
13: Base electrode
21A: p-Type organic semiconductor layer (collector layer)
22B: p-Type organic semiconductor layer (collector layer)
22: p-Type organic semiconductor layer (emitter layer)
31A: Current transmission promotion layer (collector layer side current transmission promotion layer)
31B: Current transmission promotion layer (emitter layer side current transmission promotion layer)
41: Hole injection layer
51A: Dark current suppression layer (collector layer side dark current suppression layer)
51B: Dark current suppression layer (emitter layer side dark current suppression layer)

The invention claimed is:

1. A transistor element having a laminated structure, the laminated structure comprising:
   an emitter electrode;
   a collector electrode;
   a sheet-like base electrode placed between the emitter electrode and the collector electrode;
   a plurality of p-type organic semiconductor layers, wherein each of both a top side and a bottom side of the sheet-like base electrode comprises at least one p-type organic semiconductor layer; and further
   a plurality of current transmission promotion layers, each of which comprises lithium fluoride,
      wherein at least one current transmission promotion layer is present on both the top side and the bottom side of the sheet-like base electrode, between the sheet-like base electrode and the at least one p-type organic semiconductor layer on both the top side and the bottom side of the sheet-like base electrode,
   wherein the sheet-like base electrode comprises a sheet made of a material functioning as an electrode and has no discontinuous portion in the sheet.

2. The transistor element according to claim 1, wherein the current transmission promotion layer has a thickness in a range from 0.1 to 10 nm.

3. The transistor element according claim 1, wherein the laminate structure further comprises at least one hole injection layer between the emitter electrode and the p-type organic semiconductor layer provided on a side of the emitter electrode.

4. The transistor element according to claim 1, wherein the p-type organic semiconductor layer provided on a side of the collector electrode has a laminated structure comprising two or more p-type organic semiconductor layers different from each other.

5. The transistor element according to claim 1,
   wherein under a common emitter condition, when −5V of a collector voltage $V_c$ is applied between the emitter electrode and the collector electrode and −3V of a base voltage $V_B$ is applied between the emitter electrode and the sheet-like base electrode, an absolute value of a collector current $I_{C\text{-}ON}$ in mA/cm$_2$ is in a range of 1 or more, and
   a current amplification factor of a modulated collector current $I_C$ is in a range of 4.36 or more, where the current amplification factor of the modulated collector current $I_C$ is a ratio of a change in the collector current $I_{C\text{-}ON}$ relative to a change in a base current $I_{B\text{-}ON}$ with and without the −3V of a base voltage $V_B$, and
   an ON/OFF ratio ($I_{C\text{-}ON}/I_{C\text{-}OFF}$) is in a range of 64.1 or more, where the ON/OFF ratio is a ratio of the collector current $I_{C\text{-}ON}$ relative to a collector current $I_{C\text{-}OFF}$ obtained by applying the −5V of the collector voltage $V_C$ but the −3V of a base voltage $V_B$ is not applied.

6. The transistor element according to claim 1, wherein the sheet in the sheet-like base electrode is a sheet of aluminum.

7. The transistor element according to claim 1, further comprising at least one dark current suppression layer, wherein the at least one dark current suppression layer is formed on at least one of the top side and the bottom side of the sheet-like base electrode and between the sheet-like base electrode and the at least one current transmission promotion layer.

8. The transistor element according to claim 1, further comprising a plurality of dark current suppression layers, wherein at least one of the dark current suppression layers is formed on each of both the top side and the bottom side of the sheet-like base electrode and between the sheet-like base electrode and the at least one current transmission promotion layer.

9. The transistor element according to claim 1,
   wherein a thickness of the at least one current transmission promotion layer placed between the emitter electrode and the sheet-like base electrode is thicker than a thickness of the at least one current transmission promotion layer placed between the collector electrode and the sheet-like base electrode.

* * * * *